United States Patent
Lee et al.

(10) Patent No.: US 10,115,562 B2
(45) Date of Patent: Oct. 30, 2018

(54) SYSTEMS INCLUDING A BEAM PROJECTION DEVICE PROVIDING VARIABLE EXPOSURE DURATION RESOLUTION

(71) Applicant: Samsung Electronics Co., Ltd., Suwon-si, Gyeonggi-do (KR)

(72) Inventors: Suyoung Lee, Seongnam-si (KR); Tamamushi Shuichi, Hwaseong-si (KR); Byunggook Kim, Seoul (KR); Byoungsup Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/252,828

(22) Filed: Aug. 31, 2016

(65) Prior Publication Data
US 2017/0133199 A1    May 11, 2017

(30) Foreign Application Priority Data
Nov. 10, 2015 (KR) .................. 10-2015-0157556

(51) Int. Cl.
| | | |
|---|---|---|
| *H01J 37/302* | (2006.01) | |
| *H01J 37/04* | (2006.01) | |
| *H01J 37/317* | (2006.01) | |

(52) U.S. Cl.
CPC .......... *H01J 37/302* (2013.01); *H01J 37/045* (2013.01); *H01J 37/3177* (2013.01); *H01J 2237/0432* (2013.01); *H01J 2237/0437* (2013.01)

(58) Field of Classification Search
CPC ...... H01J 37/302; H01J 37/045; H01J 37/243; H01J 37/3177; H01J 2237/2487
See application file for complete search history.

(56) References Cited

U.S. PATENT DOCUMENTS

| | | | |
|---|---|---|---|
| 5,430,304 A | | 7/1995 | Yasuda et al. |
| 7,265,361 B2 | | 9/2007 | Blanding et al. |
| 7,332,730 B2 | | 2/2008 | Heinitz et al. |
| 8,378,319 B2 | | 2/2013 | Krecinic et al. |
| 9,040,935 B2 | | 5/2015 | Morita et al. |
| 9,082,581 B2 | | 7/2015 | Matsumoto |
| 9,083,581 B1 | | 7/2015 | Matsumoto |
| 9,287,090 B2 | | 3/2016 | Yoshikawa et al. |
| 2005/0242303 A1* | 11/2005 | Platzgummer | ......... B82Y 10/00 250/492.22 |
| 2006/0170367 A1* | 8/2006 | Bhutta | ............. H01J 37/32174 315/111.21 |
| 2007/0069148 A1* | 3/2007 | Blanding | .............. H01J 37/045 250/396 R |

(Continued)

FOREIGN PATENT DOCUMENTS

JP        2007329220        12/2007

*Primary Examiner* — Jason McCormack
*Assistant Examiner* — Sean Luck
(74) *Attorney, Agent, or Firm* — Ward and Smith, P.A.

(57) ABSTRACT

A system includes an aperture array comprising a plurality of active apertures, respective ones of the active apertures configured to selectively deflect beams passing therethrough. The system also includes a limiting aperture configured to pass beams not deflected by the active apertures to a target object. The system further includes a control circuit configured to control the active apertures to provide first and second different exposure duration resolutions.

24 Claims, 14 Drawing Sheets

(56) References Cited

U.S. PATENT DOCUMENTS

| | | | |
|---|---|---|---|
| 2010/0237262 A1* | 9/2010 | Usa | B82Y 10/00 |
| | | | 250/492.3 |
| 2011/0240607 A1* | 10/2011 | Stecker | B23K 15/0086 |
| | | | 219/121.17 |
| 2013/0199719 A1 | 8/2013 | Tsuchiya et al. | |
| 2014/0152189 A1* | 6/2014 | Gilmore | H01J 37/32183 |
| | | | 315/224 |
| 2015/0155130 A1 | 6/2015 | Kikuchi | |
| 2015/0155135 A1 | 6/2015 | Kato | |

* cited by examiner

FIG. 12
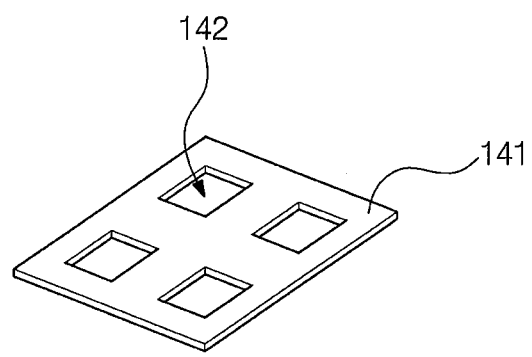
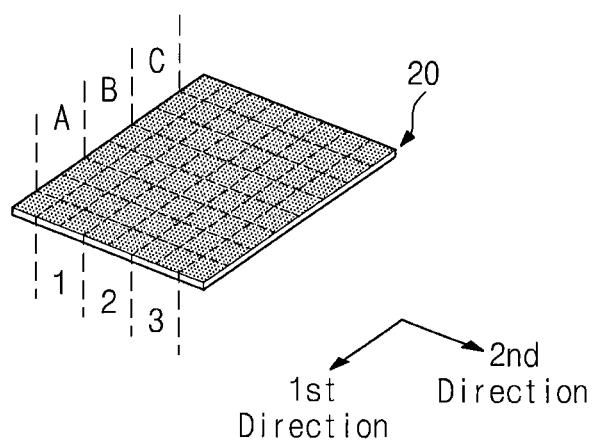

SYSTEMS INCLUDING A BEAM PROJECTION DEVICE PROVIDING VARIABLE EXPOSURE DURATION RESOLUTION

CROSS-REFERENCE TO RELATED APPLICATIONS

A claim for priority under 35 U.S.C. § 119 is made to Korean Patent Application No. 10-2015-0157556 filed Nov. 10, 2015, in the Korean Intellectual Property Office, the entire contents of which are hereby incorporated by reference.

BACKGROUND

The inventive concept disclosed herein relates to beam projection devices and methods and, more particularly, to a beam projection device which projects a beam to a mask and a material for semiconductor manufacturing.

Manufacturing a semiconductor integrated circuit typically involves making a mask and patterning a silicon wafer using the mask. A beam projection device may be used in making the mask or in the patterning. The beam projection device may project a fine beam or beams toward a target object to a desired shape.

Generally, higher resolution masks are required as a semiconductor manufacturing process becomes finer. However, components of beam projection devices have been reduced in size as semiconductor manufacturing processes have become finer. Space for components of miniaturized beam projection devices has been reduced, thereby making it difficult to add or change components. Accordingly, there is required a new method or device capable of improving the resolution of miniaturized beam projection devices.

SUMMARY

Embodiments of the inventive concept can provide systems including a beam projection device with improved resolution and method of operating the same. Some embodiments provide a beam projection device including a beam source configured to radiate a first beam, an aperture plate having a first array of apertures therein, respective ones of the apertures configured to generate respective second beams from the first beam, a blanking aperture plate having an array of blanking apertures therein corresponding to respective apertures of the first array of apertures and configured to selectively deflect second beams passing therethrough responsive to voltages applied to respective potential electrodes of the blanking apertures and a limiting aperture plate including a limiting aperture configured to pass ones of the second beams not deflected by the blanking apertures. The device further includes a plurality of electrode control circuits, respective ones of which are configured to apply voltages to respective ones of the potential electrodes. During a first time interval, the plurality of electrode control circuits applies voltages to the potential electrodes for durations based on clock signal with a first frequency. During a second time interval, the plurality of electrode control circuits applies voltages to the potential electrodes for durations based on a clock signal with a second frequency different from the first frequency.

Another aspect of embodiments of the inventive concept is directed to provide a method of projecting a beam to a target object using a beam projection device. The method may include projecting beams, of which projection times are different from each other based on a first frequency, to the target object during a first time interval using the beam projection device, and projecting beams, of which projection times are different from each other based on a second frequency, to the target object during a second time interval using the beam projection device.

Still another aspect of embodiments of the inventive concept is directed to provide a method of projecting a beam to a target object using a beam projection device. A method of operating a beam projection device including a beam source configured to radiate a first beam, an aperture plate having a first array of apertures therein, respective ones of the apertures configured to generate respective second beams from the first beam, a blanking aperture plate having an array of blanking apertures therein corresponding to respective apertures of the first array of apertures and configured to selectively deflect second beams passing therethrough responsive to voltages applied to respective potential electrodes of the blanking apertures, and a limiting aperture plate including a limiting aperture configured to pass ones of the second beams not deflected by the blanking apertures. During a first time interval, applying voltages to the potential electrodes for durations based on clock signal having a first frequency. During a second time interval, applying voltages to the potential electrodes for durations based on a clock signal having a second frequency different from the first frequency.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 8 to 13 show operations in which a beam projection device according to some embodiments of the inventive concept projects a beam to a target object.

DETAILED DESCRIPTION

Below, embodiments of the inventive concepts will be described in detail with reference to the attached drawings to the extent that the scope and spirit of the inventive concept is easily implemented by a person of ordinary skill in the art to which the inventive concept belongs.

Figure 1:
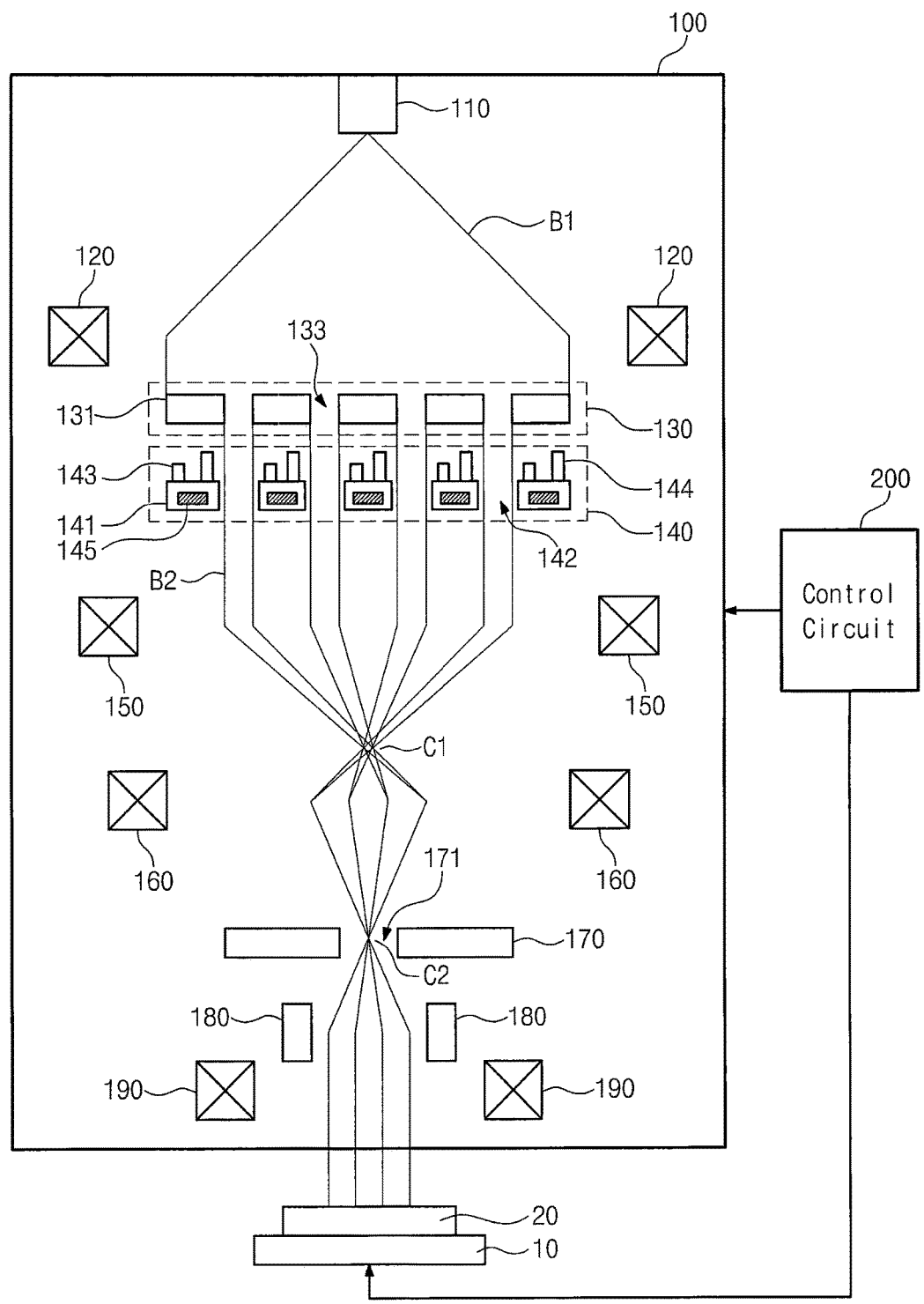
FIG. 1 shows a beam projection device according to some embodiments of the inventive concept.

FIG. 1 shows a system according to some embodiments of the inventive concept. Referring to FIG. 1, a beam projection device 100 includes a beam source 110, first lenses 120, an aperture array 130, a blanking aperture array 140, second lenses 150, third lends 160, a limiting aperture plate 170, a deflecting element 180, and fourth lenses 190. The beam projection device 100 is configured to project beams on a target 20 disposed on a stage 10. The beam projection device 100 and the stage 20 may be controlled by a system control circuit 200.

The beam source 110 may radiate a first beam B1 in a direction of the aperture array 130. For example, the beam source 110 may radiate a particle beam including an ion beam, such as a hydrogen ion or an argon ion beam, or an electron beam as the first beam B1. For example, the first beam B1 from the beam source 110 may have kinetic energy of 5 KeV to 100 KeV.

The first lenses 120 may deflect or adjust the first beam B1 so as to be incident on the aperture array 130. The first beam B1 may have wide-area and telecentric characteristics controlled by the first lenses 120. For example, the first lenses 120 may include electrostatic or electromagnetic lenses. The first beam B1 may be deflected or adjusted by the first lenses 120 to be incident on the aperture array 130. For example, the first beam B1 may be incident on the aperture array 130 along a direction perpendicular to the aperture array 130.

The aperture array 130 may be formed in an aperture array plate 131. A plurality of apertures 133 may be formed in the aperture array plate 131 of the aperture array 130. The apertures 133 may be arranged in a matrix. The aperture array 130 may enable portions of the first beam B1 corresponding to the apertures 133 to be output as a plurality of second beamlets B2. The aperture array 130 may block the remaining portions of the first beam B1. For example, the aperture array 130 may output a plurality of beams B2 through the apertures 133 and block the remaining beams other than the beams B2, thereby preventing elements arranged following the aperture array 130 from being damaged. For example, the aperture array plate 131 may be coated with an inoxidizable metal layer, such as an iridium-containing layer.

The second beamlets B2 passing through the aperture array 130 may be incident on the blanking aperture array 140. The blanking aperture array 140 may include a blanking aperture array plate 141. A plurality of blanking apertures 142 may be formed in the blanking aperture plate 141 of the blanking aperture array 140. The blanking apertures 142 may be arranged in a matrix.

The blanking apertures 142 may be formed at the same positions as the apertures 133. A width of each of the blanking apertures 142 may be greater than that of each of the apertures 133. The second beamlets B2 passing through the aperture array 133 may pass through the blanking apertures 143.

A plurality of first electrodes 143 and a plurality of second electrodes 144 may be formed on an upper surface of the blanking plate 141, that is, on a surface adjacent the aperture array 130. The first electrodes 143 and the second electrodes 144 may be arranged in association with the blanking apertures 142 such that they together form active apertures that are configured to selectively deflect beams passing through the blanking apertures 142 responsive to voltages applied between the first electrodes 143 and the second electrodes 144. For example, one first electrode 143 and one second electrode 144 may be disposed adjacent one blanking aperture 142. For example, the first electrodes 143 may be potential electrodes to which voltage that may vary between a ground voltage and a non-ground voltage (e.g., a positive voltage or a negative voltage) is applied. The second electrodes 144 may be ground electrodes to which a ground voltage is applied.

A plurality of electrode control circuits 145 may be disposed in or otherwise supported by the blanking aperture plate 141. Respective ones of the electrode control circuits 145 may correspond to respective ones of the first electrodes 143. The electrode control circuits 145 may be disposed adjacent the blanking apertures 142 and may selectively apply a non-ground voltage or a ground voltage to the first electrodes 143. For example, the electrode control circuits 145 may be formed on an upper surface, a lower surface, and/or the inside of the blanking aperture plate 141.

When voltages of the first and second electrodes 143 and 144 adjacent to one blanking aperture 142 are the same as each other, for example, when the ground voltages are respectively applied to the first and second electrodes 143 and 144, an electric field may not be generated between the first electrode 143 and the second electrode 144. Consequently, a corresponding second beamlet B2 may pass through the blanking aperture 142 without a change in a propagation direction.

When voltages of the first and second electrodes 143 and 144 adjacent to one blanking aperture 142 are different from each other, for example, when the non-ground voltage is applied to the first electrode 143 and the ground voltage is applied to the second electrode 144, an electric field may be generated between the first electrode 143 and the second electrode 144. As described with reference to the beam source 110, the second beamlets B2 may include particles having the same polarity as an electron or an ion. Accordingly, when an electric field is generated between the first electrode 143 and the second electrode 144, a direction of a corresponding second beamlet B2 passing through the blanking aperture 142 may be changed. Accordingly, the electrode control circuits 145 of the blanking aperture array 140 may selectively adjust or maintain directions of the second beamlets B2 passing through the blanking apertures 142 by adjusting voltages applied to the first electrodes 143.

The second beamlets B2 passing through the blanking aperture array 140 may be accelerated and/or deflected by the second lenses 150. For example, the second lenses 150 may deflect and focus the second beamlets B2. The second beamlets B2 accelerated and deflected by the second lenses 150 may pass through a first crossing C1 and may be deflected by the third lenses 160. For example, the third lenses 160 may focus a plurality of second beamlets.

The second beamlets deflected by the third lenses 160 may be incident on the limiting aperture plate 170. One limiting aperture 171 may be formed in the limiting aperture plate 170.

In some embodiments, beamlets, of which the directions are not changed at the blanking aperture array 140, from among the second beamlets B2, for example, original beamlets may pass through a second crossing C2 in the limiting aperture 171. Original beamlets passing through the second crossing C2 in the limiting aperture 171 may be deflected by the deflecting elements 180 and the fourth lenses 190 so as to be projected to the outside. In some embodiments, the deflecting elements 180 may adjust positions of the second beamlets B2 with respect to a target object 20 by adjusting projection directions of the second beamlets B2.

Beamlets, of which the directions are changed at the blanking aperture array 140, from among the second beamlets B2, for example, adjusted beamlets may be propagated in a direction different from the original beamlets. Like the original beamlets, the adjusted beamlets may be deflected by the second lenses 150 but may not pass through the first crossing C1. Furthermore, the adjusted beamlets may be deflected by the third lenses 160 but may not pass through the second crossing C2. In more detail, the adjusted beamlets may not pass through the limiting aperture 171 and may be blocked by the limiting aperture plate 170.

Second beamlets B2 of which the directions are not adjusted at the blanking aperture array 140 may be projected to the outside through the limiting aperture plate 170, and second beamlets B2 of which the directions are adjusted at the blanking aperture array 140 may be blocked by the limiting aperture plate 170 so as not to be projected to the outside. Accordingly, the electrode control circuits 145 of the blanking aperture array 140 may adjust voltages applied to the first electrodes 143, thereby making it possible to selectively project the second beamlets B2 to the outside or stop projecting the second beamlets B2.

The second beamlets B2 projected from the beam projection device 100 may be incident on the target object 20, which may be, for example, a mask material or a silicon wafer. The target object 20 may be mounted on a movable stage 10. Furthermore, the beam projection device 100 may be movable together with the stage 10. The beam projection device 100 may move when the target object 20 mounted on the stage 10 moves, and thus relative positions of the target object 20 and the beam projection device 100 may be maintained.

Figure 2:
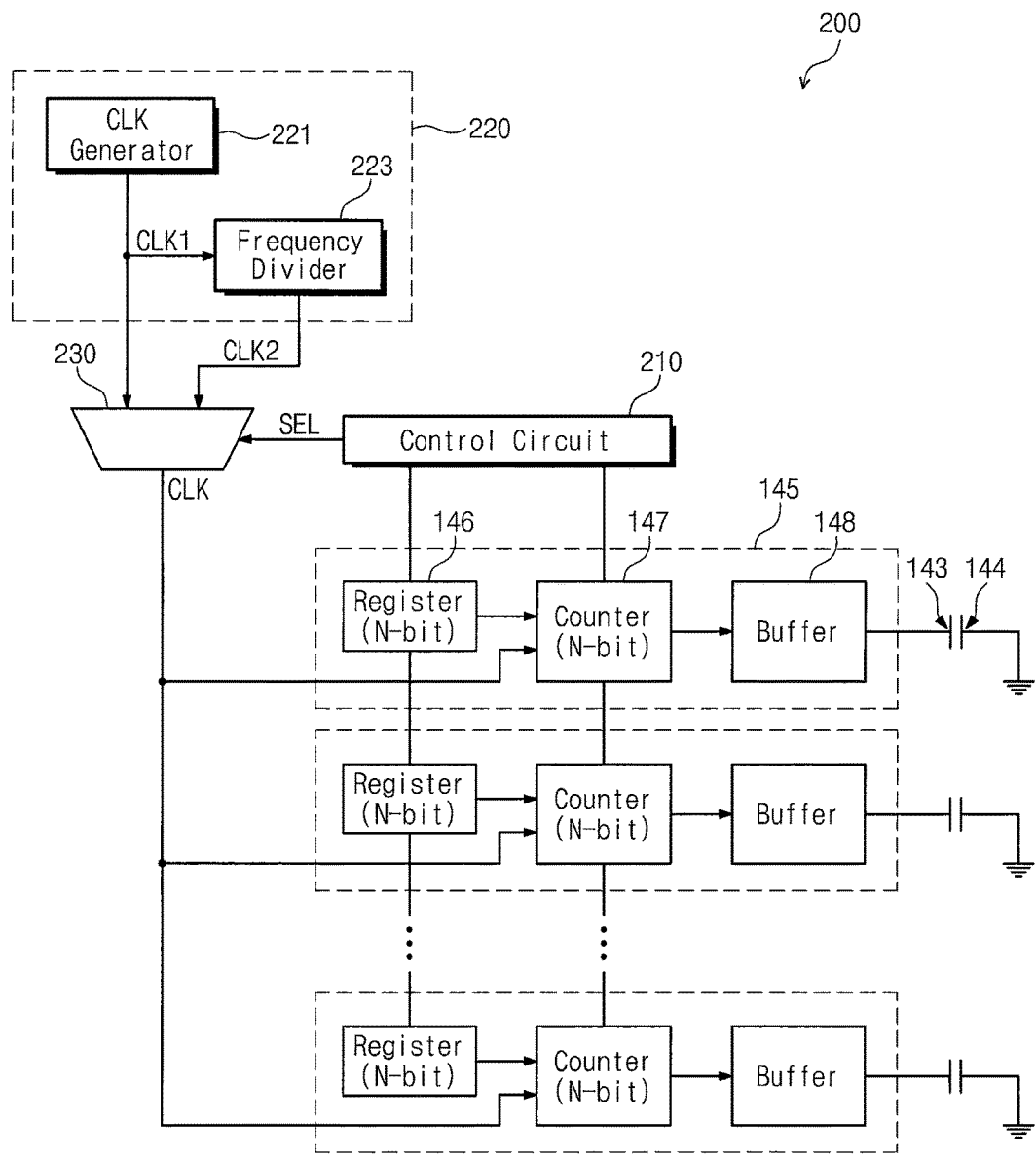
FIG. 2 is a block diagram illustrating electrode control circuits according to some embodiments of the inventive concept.

FIG. 2 is a block diagram illustrating electrode control circuits 145 of the system control circuit 200 of FIG. 1 according to some embodiments of the inventive concept. Referring to FIGS. 1 and 2, the electrode control circuits 145 may be controlled by a control circuit 210. The electrode control circuits 145 may operate in response to a clock signal CLK from a multiplexer 230. Each of the electrode control circuits 145 may be configured to apply a voltage (e.g., a non-ground voltage or a ground voltage) to a corresponding first electrode 143. The first electrode 143 may be capacitively coupled with the second electrode 144 to which the ground voltage is applied.

Each of the electrode control circuits 145 may include a register 146, a counter 147, and a buffer 148. The register 146 may be configured to receive and store N-bit data from the control circuit 210. For example, N-bit data stored in the register 146 may be associated with a time when the ground voltage is applied to the first electrode 143 and a time when the non-ground voltage is applied thereto. That is, the N-bit data stored in the register 146 may be associated with times to project a second beamlet, which passes through the blanking aperture associated with the first electrode 143, and times to block the second beamlet.

The counter 147 may be initialized (or reset) by the control circuit 210. The counter 147 may be configured to receive N-bit data from the register 146. In response to the clock signal CLK, the counter 147 may be configured to perform counting from an initial value (e.g., 0) to a predetermined N-bit value. For example, the counter 147 may output a first value while counting is performed. The counter 147 may output a second value after the counting ends.

The buffer 148 may receive an output of the counter 147. When the counter 147 outputs the first value, that is, when the counter 147 is performing counting, the buffer 148 may apply the ground voltage to the first electrode 143. When the counter 147 outputs the second value, that is, when a count operation of the counter 147 ends, the buffer 148 may apply the non-ground voltage to the first electrode 143.

In summary, the buffer 148 may apply the ground voltage to the first electrode 143 while the counter 147 performs a count operation from the initial value to the value of the N-bit data stored in the register 146. That is, a second beamlet B2 passing through a blanking aperture may be projected to the target. If the value of the N-bit data is counted by the counter 147, the buffer 148 may apply the non-ground voltage to the first electrode 143. That is, a second beamlet B2 passing through a blanking aperture may be blocked by a limiting aperture plate 170 so as not to be projected to the target.

The multiplexer 230 may be configured to receive a first clock signal CLK1 and a second clock signal CLK2 from a clock generation unit 220. The multiplexer 230 may be configured to output one of the first clock signal CLK1 and the second clock signal CLK2 as the clock signal CLK in response to a selection signal SEL from the control circuit 210. In some embodiments, a frequency of the first clock signal CLK1 may be different from that of the second clock signal CLK2.

The clock generation unit 220 may include a clock generator 221 and a frequency divider 223. The clock generation unit 220 may output the first clock signal CLK1 to the multiplexer 230 and the frequency divider 223. The frequency divider 223 may divide the first clock signal CLK1 so as to be output as the second clock signal CLK2. In some embodiments, the frequency divider 223 may have a division ratio associated with the number of bits of the register 146 or the counter 147, that is, N bits. For example, the frequency divider 223 may divide the first clock signal CLK1 by $\frac{1}{2}^N$ to generate the second clock signal CLK2.

In some embodiments of the inventive concept, the clock generation unit 220 generates the second clock signal CLK2 using the frequency divider 223. However, the clock generation unit 220 may be implemented to use a frequency multiplier instead of the frequency divider 223. For example, the frequency multiplier may output $2^N$ times an input frequency. That is, with regard to N-bit of the register 146 or the counter 147, the clock generation unit 220 may output the first clock signal CLK1 and the second clock signal CLK2 in which a difference is $2^N$ times or $\frac{1}{2}^N$ times.

In some embodiments, the electrode control circuits 145 may be disposed in and/or on the blanking aperture plate 141 of the blanking aperture array 140. The control circuit 210, the clock generation unit 220, and the multiplexer 230 may be disposed outside the blanking aperture array 140 and inside the beam projection device 100 and may be connected with the electrode control circuits 145 through wiring.

Figure 3:
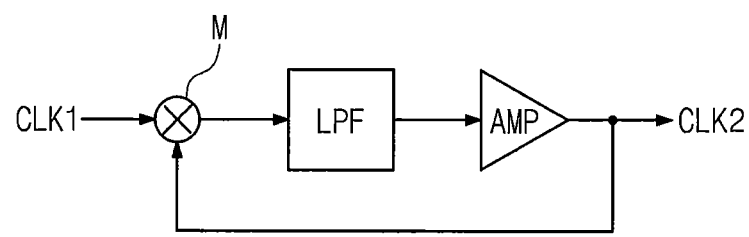
FIG. 3 is a diagram illustrating an example of a frequency divider of FIG. 2.

FIG. 3 is a diagram illustrating an example of a frequency divider 223 of FIG. 2. Referring to FIG. 3, the frequency divider 223 may include a multiplier M, a low pass filter LPF, and an amplifier AMP. The multiplier M may multiply the first clock signal CLK1 and the second clock signal CLK2. The multiplier M may output harmonics of frequencies of the first and second clock signals CLK1 and CLK2. The low pass filter LPF may pass a component, which corresponds to a frequency of the second clock signal CLK2, of an output signal of the multiplier M and may block harmonic components corresponding to a frequency higher than the component. The amplifier AMP may amplify a signal passing through the low pass filter LP and may output the amplified signal as the second clock signal CLK2. The second clock signal CLK2 may be fed back to the multiplier M.

Figure 4:
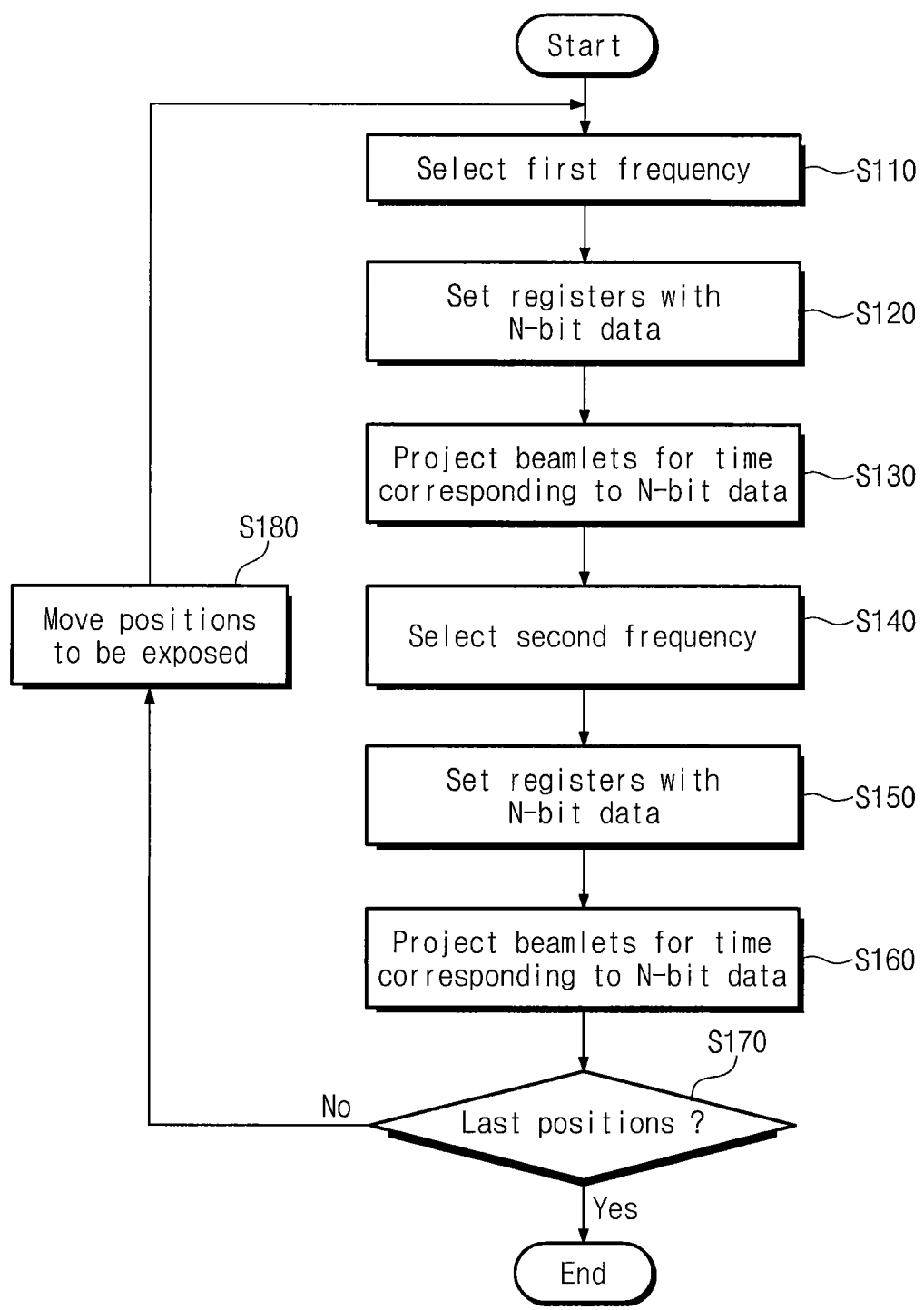
FIG. 4 is a flow chart illustrating operations of a beam projection device according to some embodiments of the inventive concept.

FIG. 4 is a flow chart illustrating operations of a beam projection device 100 according to some embodiments of the inventive concept. Referring to FIGS. 1, 2, and 4, in step S110, the control circuit 210 may select a first frequency. For example, the control circuit 210 may control the multiplexer 230 through the selection signal SEL so as to output the first clock signal CLK1.

In step S120, the control circuit 210 may set the registers 146 of the electrode control circuits 145 with N-bit data. For example, times to project the second beamlets B2 may vary according to positions of the blanking apertures 142 and a target structure of a mask. The control circuit 210 may set the respective registers 146 of the electrode control circuits 145 with respective N-bit data values corresponding to projection times of the second beamlets B2.

In step S130, the beam projection device 100 may project the second beamlets B2 during a time corresponding to the N-bit data. For example, the counter 147 of each electrode control circuit 145 may perform counting from an initial value from a value of the N-bit data. The buffer 148 may apply a ground voltage to the first electrode 143 during counting to allow the second beamlet B2 to be projected. After a value corresponding to the N-bit data is counted by the counter 147, the buffer 148 may apply the non-ground voltage to the first electrode 143 to block the second beamlet B2.

If the projection of the second beamlets B2 having the N-bit resolution based on the first frequency ends, in step S140, a second frequency may be selected. For example, the control circuit 210 may control the multiplexer 230 through the selection signal SEL so as to output the second clock signal CLK2.

In step S150, the control circuit 210 may set the registers 146 of the electrode control circuits 145 with N-bit data values. For example, times to project the second beamlets B2 may vary according to positions of the blanking apertures 142 and a target structure of a mask. The control circuit 210 may set the respective registers 146 of the electrode control circuits 145 with respective N-bit data values corresponding to projection times of the second beamlets B2. In some embodiments, the N-bit data values set in step S150 may be different from the N-bit data values set in step S120.

In step S160, the beam projection device 100 may project the second beamlets during a time corresponding to the N-bit data values. For example, the counter 147 of each electrode control circuit 145 may perform counting from an initial value to the N-bit data value. The buffer 148 may apply a ground voltage to the first electrode 143 during counting to allow the second beamlet B2 to be projected. If a value corresponding to the N-bit data value is counted by the counter 147, the buffer 148 may apply the non-ground voltage to the first electrode 143 to block the second beamlet B2.

If a value corresponding to the N-bit data value is counted by the counter 147, the procedure may proceed to step S170. In step S170, whether positions of the target object 10 to be exposed to the second beamlets B2 are the last positions may be determined. If so, the projection on the target object 10 may end. For example, the process of projecting the second beamlets B2 to the target object 10 may end. Otherwise, the procedure may proceed to step S180, in which positions to which the second beamlets B2 may move to next positions. For example, positions to which the second beamlets B2 are to be projected may be adjusted or shifted by the deflecting elements 180.

As described above, a beam projection device 100 according to some embodiments of the inventive concept may project the second beamlets B2 with the N-bit resolution based on the first frequency to provide a first exposure duration resolution, under the condition that positions to which the second beamlets B2 are to be projected are fixed. Afterwards, the beam projection device 100 may project the second beamlets B2 with the N-bit resolution based on the second frequency to provide a second exposure duration resolution. The first frequency and the second frequency may have a relation of $2^N$ times or $½^N$ times. Accordingly, the beam projection device 100 may project the second beamlets B2 with a 2N-bit resolution to the target object 10.

Figure 5:
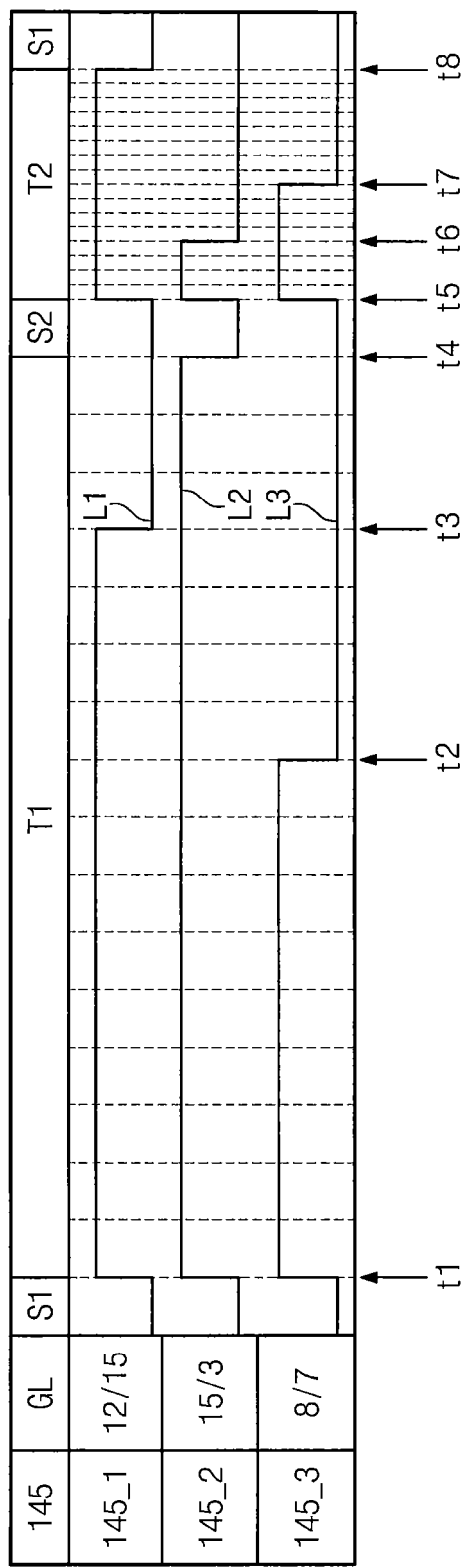
FIG. 5 is a timing diagram illustrating an example in which second beamlets are projected by a beam projection device.

FIG. 5 is a timing diagram illustrating an example in which second beamlets B2 are projected by a beam projection device 100. Some embodiments in which whether to project second beamlets B2 is controlled by first to third electrode control circuits 145_1 to 145_3 will be described with reference to FIGS. 1, 2, and 5.

In a first time interval S1, the registers 146 and the counters 147 of the first to third electrode control circuits 145_1 to 145_3 may be reset or initialized. Afterwards, N-bit data values corresponding to a first frequency may be input to the registers 146 of the first to third electrode control circuits 145_1 to 145_3. The beam projection device 100 may not project the second beamlets B2 while the registers 146 are set with the N-bit data values in the first setting time interval S1. Accordingly, first to third lines L1 to L3 which indicate projection of the second beamlets B2 associated with the first to third electrode control circuits 145_1 to 145_3 may be at a low level.

The N-bit resolution may correspond to a gray level (GL). In some embodiments, an N-bit data value which is set at the first electrode control circuit 145_1 for the first time may correspond to a gray level GL of "12" and may be "1100". An N-bit data value which is set at the second electrode control circuit 145_2 for the first time may correspond to a gray level GL of "15" and may be "1111". An N-bit data value which is set at the third electrode control circuit 145_3 for the first time may correspond to a gray level GL of "8" and may be "0100".

If a first time interval T1 starts at t1, the first to third electrode control circuits 145_1 to 145_3 may apply ground voltages to respective one of the first electrodes 143. Accordingly, the second beamlets B2 corresponding to the first to third electrode control circuits 145_1 to 145_3 may be projected at the target. The first to third lines L1 to L3 which indicate the projection of the second beamlets B2 by the first to third electrode control circuits 145_1 to 145_3 may transition to a high level.

The counters 147 of the first to third electrode control circuits 145_1 to 145_3 may count from an initial value to the respective N-bit data values which are loaded in the registers 146. While the counters 147 count, the first to third electrode control circuits 145_1 to 145_3 may apply the ground voltages to the first electrodes 143. Accordingly, the second beamlets B2 corresponding to the first to third electrode control circuits 145_1 to 145_3 may be projected towards the target.

Times when the counters 147 count may be determined according to the N-bit data values stored in the registers 146. In some embodiments, for convenience, times when the counters 147 perform counting are illustrated by a decimal scale based on gray levels GL.

At t2, count values of the counters 147 of the first to third electrode control circuits 145_1 to 145_3 may reach a gray level GL of "8". Accordingly, the counter 147 of the third electrode control circuit 145_3 may end counting and the third electrode control circuit 145_3 may apply the non-ground voltage to the first electrode 143, thus blocking projection of the second beamlets B2 corresponding to the third electrode control circuit 145_3. The third line L3 which indicates the projection of the second beamlet B2 controlled by the third electrode control circuit 145_3 may transition to a low level. The projection of the second beamlets B2 associated with the first and second electrode control circuits 145_2 and 145_3 may continue.

At t3, count values of the counters 147 of the second and third electrode control circuits 145_2 and 145_3 may reach a gray level GL of "12". Accordingly, the counter 147 of the first electrode control circuit 145_1 may end counting and the first electrode control circuit 145_1 may apply the non-ground voltage to the first electrode 143, thus blocking projection of the second beamlets B2 corresponding to the first electrode control circuit 145_1. The first line L1 which indicates the projection of the second beamlet B2 controlled by the first electrode control circuit 145_1 may transition to a low level.

At t4, a count value of the counter 147 of the second electrode control circuit 145_2 may reach a gray level GL of "15", and thus the first time interval T1 may end. Accordingly, the projection of the second beamlet B2 corresponding to the second electrode control circuit 145_2 may be blocked. The second line L2 which indicates the projection of the second beamlet B2 controlled by the second electrode control circuit 145_2 may transition to a low level.

In a second time interval S2, the registers 146 and the counters 147 of the first to third electrode control circuits 145_1 to 145_3 may be reset or initialized. Afterwards, N-bit data values corresponding to a second frequency may be input into the registers 146 of the first to third electrode control circuits 145_1 to 145_3. The beam projection device 100 may not project the second beamlets B2 while the registers 146 are set with the N-bit data values in the second setting time interval S2. Accordingly, first to third lines L1 to L3 which indicate projection of the second beamlets B2 associated with the first to third electrode control circuits 145_1 to 145_3 may be at a low level.

In some embodiments, an N-bit data value which is set at the first electrode control circuit 145_1 for the second time may correspond to a gray level GL of "15" and may be "1111". An N-bit data value which is set at the second electrode control circuit 145_2 for the second time may correspond to a gray level GL of "3" and may be "0011". An N-bit data value which is set at the third electrode control circuit 145_3 for the second time may correspond to a gray level GL of "7" and may be "0111".

If a second time interval T2 starts at t5, the first to third electrode control circuits 145_1 to 145_3 may apply ground voltages to respective ones of the first electrodes 143. Accordingly, the second beamlets B2 corresponding to the first to third electrode control circuits 145_1 to 145_3 may be projected towards the target. The first to third lines L1 to L3 which indicate the projection of the second beamlets B2 by the first to third electrode control circuits 145_1 to 145_3 may transition to a high level. The counters 147 of the first to third electrode control circuits 145_1 to 145_3 may count from an initial value to the N-bit data values which are stored in the registers 146.

At t6, count values of the counters 147 of the first to third electrode control circuits 145_1 to 145_3 may reach a gray level GL of "3". Accordingly, the counter 147 of the second electrode control circuit 145_2 may end counting, the second electrode control circuit 145_2 may apply the non-ground voltage to the first electrode 143, thus blocking projection of the second beamlets B2 corresponding to the second electrode control circuit 145_2. The second line L2 which indicates the projection of the second beamlet B2 controlled by the second electrode control circuit 145_2 may transition to a low level. The projection of the second beamlets B2 associated with the first and third electrode control circuits 145_1 and 145_3 may continue.

At t7, count values of the counters 147 of the first and third electrode control circuits 145_1 and 145_3 may reach a gray level GL of "7". Accordingly, the counter 147 of the third electrode control circuit 145_3 may end counting and the third electrode control circuit 145_3 may apply the non-ground voltage to the first electrode 143, thus blocking projection of the second beamlets B2 corresponding to the third electrode control circuit 145_3. The third line L3 which indicates the projection of the second beamlet B2 controlled by the third electrode control circuit 145_3 may transition to a low level.

At t8, a count value of the counter 147 of the first electrode control circuit 145_1 may reach a gray level GL of "15", and thus the second time interval T2 may end. Accordingly, the projection of the second beamlet B2 corresponding to the first electrode control circuit 145_1 may be stopped and the first line L1 which indicates the projection of the second beamlet B2 controlled by the first electrode control circuit 145_1 may transition to a low level.

Afterwards, positions to which the second beamlets B2 are to be projected may be moved, and the first setting time interval S1 and time intervals following the first setting time interval S1 may progress.

As described above, during the first time interval T1, the beam projection device 100 according to some embodiments of the inventive concept may project a beam with N-bit resolution based on the first frequency. For example, the beam projection device 100 may adjust a beam projection time by the first time scale (i.e., a time scale corresponding to a gray scale in the first time interval T1), and the beam projection time may be adjusted by the N-bit resolution. Furthermore, during the first time interval T1, the beam projection device 100 may project a beam with the N-bit resolution based on the second frequency. For example, the beam projection device 100 may adjust a beam projection time by the second time scale (i.e., a time scale corresponding to a gray scale in the second time interval T2), and the beam projection time may be adjusted by the N-bit resolution. At this time, the second time scale may correspond to $\frac{1}{2^N}$ times the first time scale. Accordingly, if the first time interval T1 and the second time interval T2 are performed, a beam may be projected to a target object with the 2N-bit resolution, and there may be provided the beam projection device 100 with improved resolution and a beam projection method thereof.

As described above, as the beam projection device 100 is miniaturized, a space of the blanking aperture array 140 where the electrode control circuits 145 are disposed may be markedly limited. Accordingly, there is a limit to increase a resolution of the beam projection device 100 by increasing the number of the registers 146 and the number of the counters 147 with regard to the electrode control circuits 145. According to embodiments of the inventive concept, a frequency of the clock signal CLK to be provided to the electrode control circuits 145 may be adjusted by $2^N$ times or $\frac{1}{2^N}$ times, and iterative exposure may be made with respect to the target object 20. Accordingly, the beam projection device 100 with improved resolution may be provided without adding components to the electrode control circuits 145 or changing components of the electrode control circuits 145.

Figure 6:
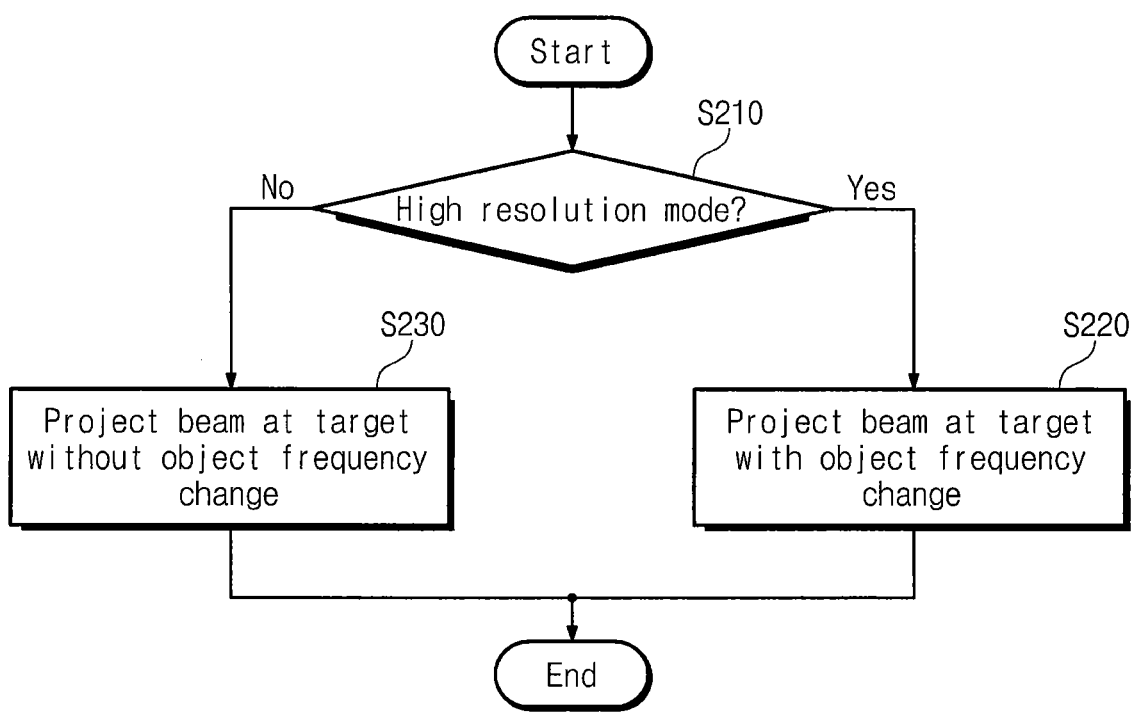
FIG. 6 is a flow chart illustrating operations in which a beam projection device according to some embodiments of the inventive concept sets a mode.

FIG. 6 is a flow chart illustrating operations of a beam projection device 100 according to some embodiments of the inventive concept. Referring to FIGS. 1, 2, and 6, in step S210, the beam projection device 100 may select a high-resolution mode. If the high-resolution mode is selected, in step S220, the beam projection device 100 may change a frequency as described with reference to FIG. 5 and may project a beam towards the target object 20. If the high-resolution mode is not selected, that is, if a low-resolution mode is selected, in step S230, the beam projection device 100 may project a beam to the target object 20 without changing a frequency. For example, the beam projection device 100 may project a beam using one initialization interval and one projection interval. After each projection interval, a position of the target object 20 may be changed by the stage 10.

Figure 7:
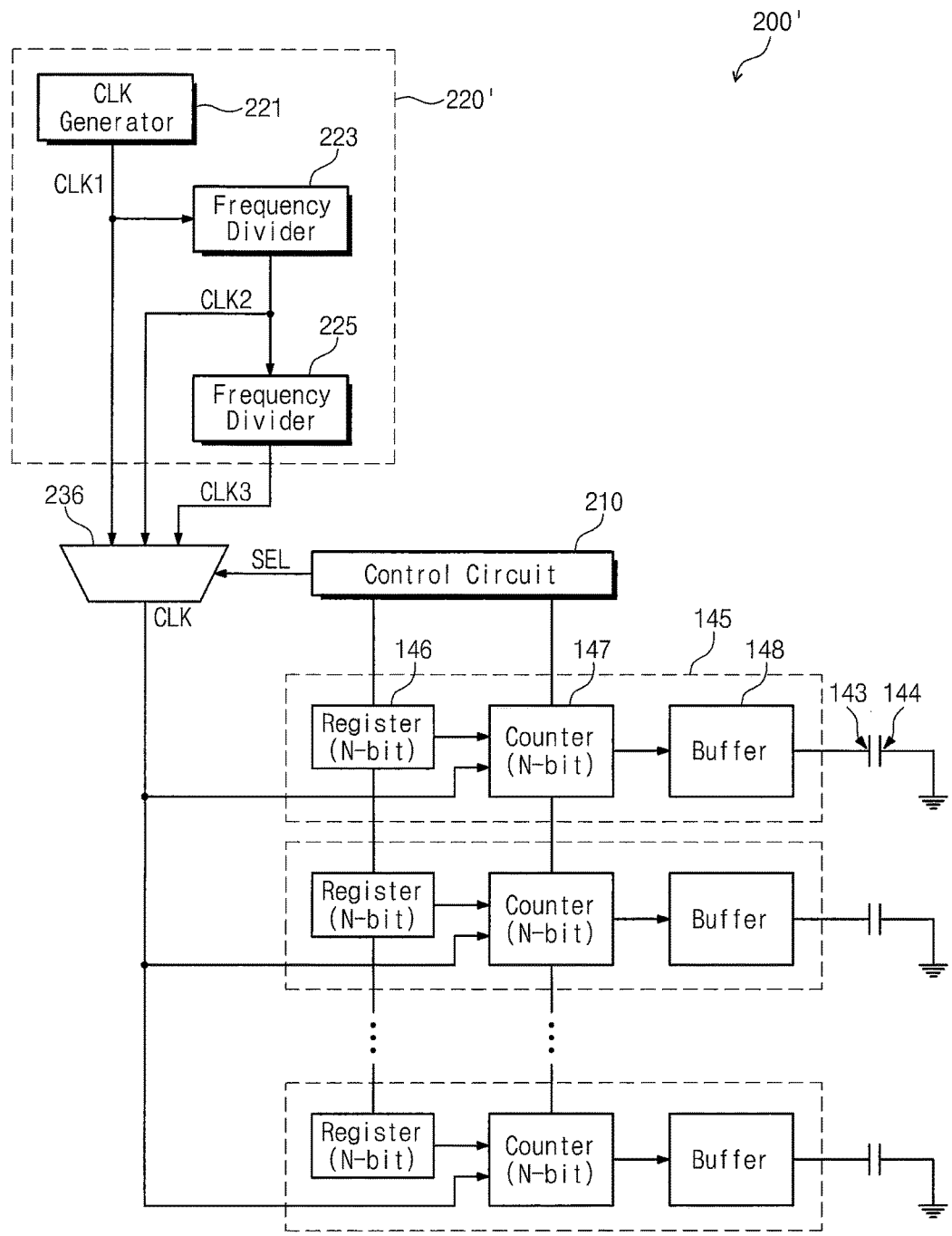
FIG. 7 is a block diagram illustrating an application of electrode control circuits of FIG. 2 and peripheral circuits.

FIG. 7 is a block diagram illustrating an application of electrode control circuits 145 of a system control circuit 200' according to further embodiments. Like numerals identify like components in FIGS. 2 and 7, and repeated description thereon may be omitted in light of the prior discussion of FIG. 7. Referring to FIG. 7, the electrode control circuits 145 may controlled by the control circuit 210 and may operate in response to a clock signal CLK from a multiplexer 230'.

Compared with the clock generation unit 220 of FIG. 2, a clock generation unit 220' may output first to third clock signals CLK1 to CLK3 of which the frequencies are different from each other. The clock generation unit 220' may include a clock generator 221, a first frequency divider 223, and a second frequency divider 225. The clock generation unit 220' may output the first clock signal CLK1 of a first frequency. The first frequency divider 223 may divide the first clock signal CLK1 by $\frac{1}{2}^N$ to generate the second clock signal CLK2. The second frequency divider 225 may divide the second clock signal CLK2 by $\frac{1}{2}^N$ to generate the third clock signal CLK3.

Compared with the multiplexer 230 of FIG. 2, the multiplexer 230' may output one of the first to third clock signals CLK1 to CLK3 as a clock signal CLK in response to the selection signal SEL. For example, as described with reference to FIG. 5, the multiplexer 230' may output the first clock signal CLK1 as the clock signal CLK during a first projection interval in which the beam projection device 100 performs a first projection. The multiplexer 230' may output the second clock signal CLK2 as the clock signal CLK during a second projection interval where the beam projection device 100 performs a second projection. The multiplexer 230' may output the third clock signal CLK3 as the clock signal CLK during a third projection interval where the beam projection device 100 performs a third projection. In summary, the beam projection device 100 may project a beam using three or more different frequencies.

In some embodiments, the first frequency divider 223 may be replaced with a frequency multiplier multiplying the first clock signal CLK1 by $2^N$ times, and the second frequency divider 225 may be replaced with a frequency multiplier multiplying the second clock signal CLK1 by $2^N$ times. In some embodiments, the clock generation unit 220' may be configured to output frequencies with a $\frac{1}{2}^N$ times or $2^N$ time relation, and a configuration thereof may not be limited to FIG. 7.

FIGS. 8 to 13 show operations of a beam projection device 100 according to some embodiments of the inventive concept for projecting a beam towards a target object 20. In FIGS. 8 to 13, the blanking plate array 141 is part of the beam projection device 100 and is used to conceptually indicate its operations.

Figure 8:
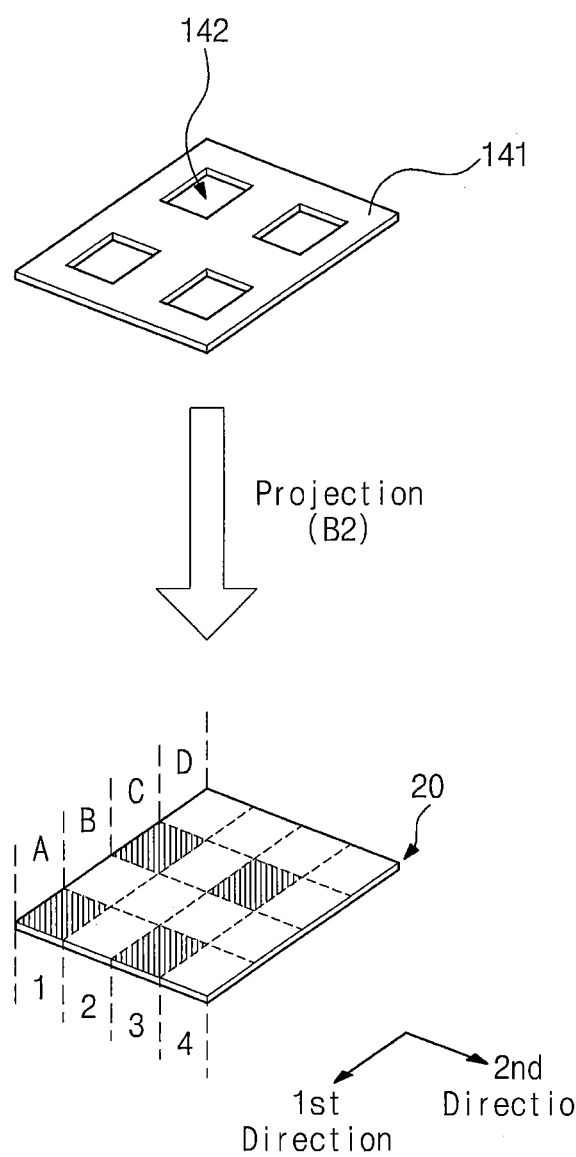

Referring to FIG. 8, four blanking apertures 142 may be formed in the blanking plate array 141. That is, the four second beamlets B2 passing through the blanking aperture array 141 may be projected to the target object 20. Positions to which the second beamlets B2 are to be projected may be adjusted by the deflecting elements 180.

For descriptive convenience, positions of the second beamlets B2 to be projected to the target object 20 may be used as pixels arranged in A to D rows and first to fourth columns.

In some embodiments, in FIG. 8, the second beamlets B2 may be projected to a pixel at the A row and the first column, a pixel at the A row and the third column, a pixel at the C row and the first column, and a pixel at the C row and the third column. Pixels to which the second beamlets B2 are projected are indicated by hatching. In some embodiments, as described with reference to FIG. 5, the beam projection device 100 may project the second beamlets B2 using different frequencies, thereby increasing the resolution of projection.

Figure 9:
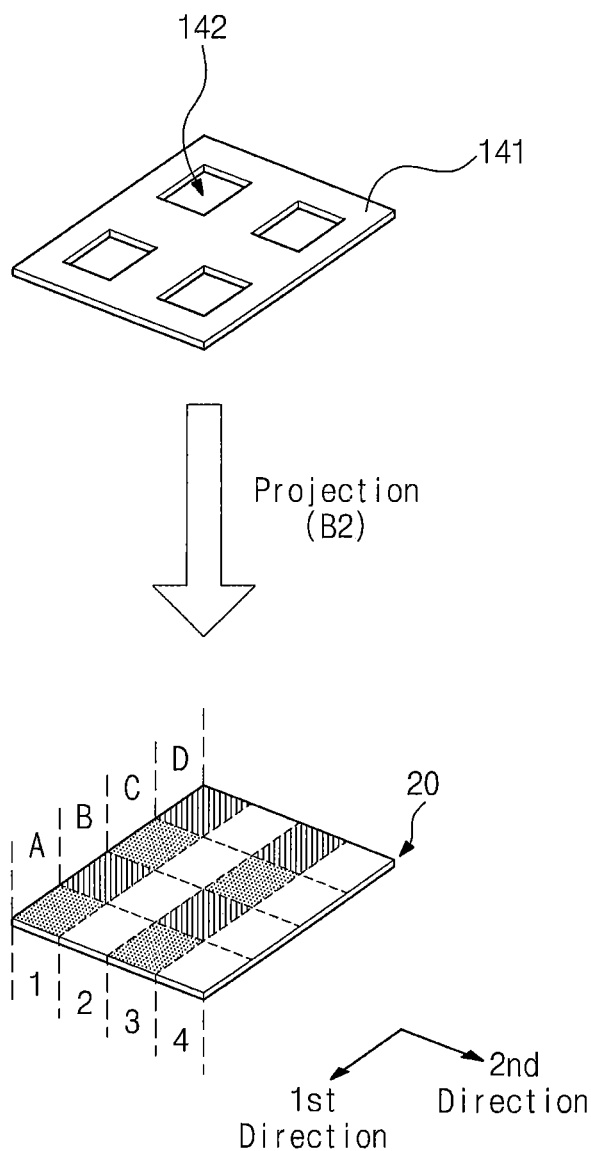

After the projection of the second beamlets B2 is completed, positions to which the second beamlets B2 are to be projected may be moved by the deflecting elements 180. For example, positions to which the second beamlets B2 are to be projected may be adjusted so that they do not overlap pixels to which the second beamlets B2 were previously projected. For example, positions to which the second beamlets B2 are to be projected may be moved along a direction opposite to a first direction. FIG. 9 shows an example in which positions to which the second beamlets B2 are to be projected is adjusted. Referring to FIG. 9, the second beamlets B2 may be projected to a pixel at the B row and the first column, a pixel at the B row and the third column, a pixel at the D row and the first column, and a pixel at the D row and the third column with regard to the target object 20. Pixels to which the second beamlets B2 were projected are identified with dotting, and pixels to which the second beamlets B2 are currently projected are indicated with hatching. In some embodiments, as described with reference to FIG. 5, the beam projection device 100 may project the second beamlets B2 using different frequencies, thereby increasing the resolution of projection.

Figure 10:
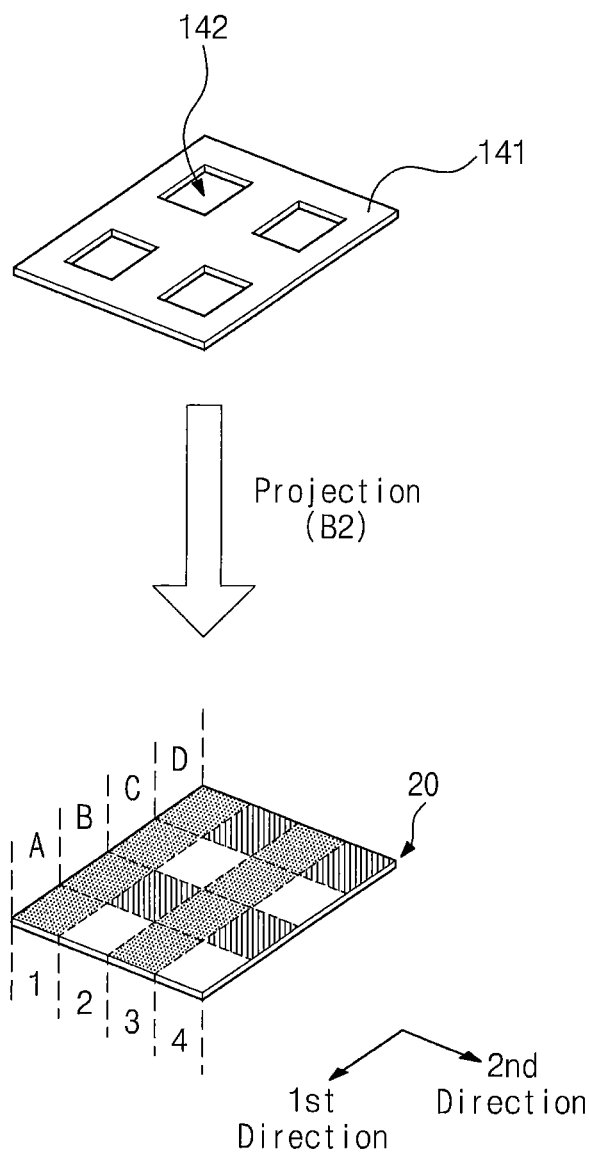

After the projection of the second beamlets B2 is completed, positions to which the second beamlets B2 are to be projected may be moved by the deflecting elements 180. For example, positions to which the second beamlets B2 are to be projected may be moved along a second direction. FIG. 10 shows an example in which positions to which the second beamlets B2 are to be projected is adjusted. Referring to FIG. 10, the second beamlets B2 may be projected to a pixel at the B row and the second column, a pixel at the B row and the fourth column, a pixel at the D row and the second column, and a pixel at the D row and the fourth column with regard to the target object 20. Pixels to which the second beamlets B2 were projected are identified as dotted, and pixels to which the second beamlets B2 are currently projected are indicated by hatching. In some embodiments, as described with reference to FIG. 5, the beam projection device 100 may project the second beamlets B2 using different frequencies, thereby increasing the resolution of projection.

Figure 11:
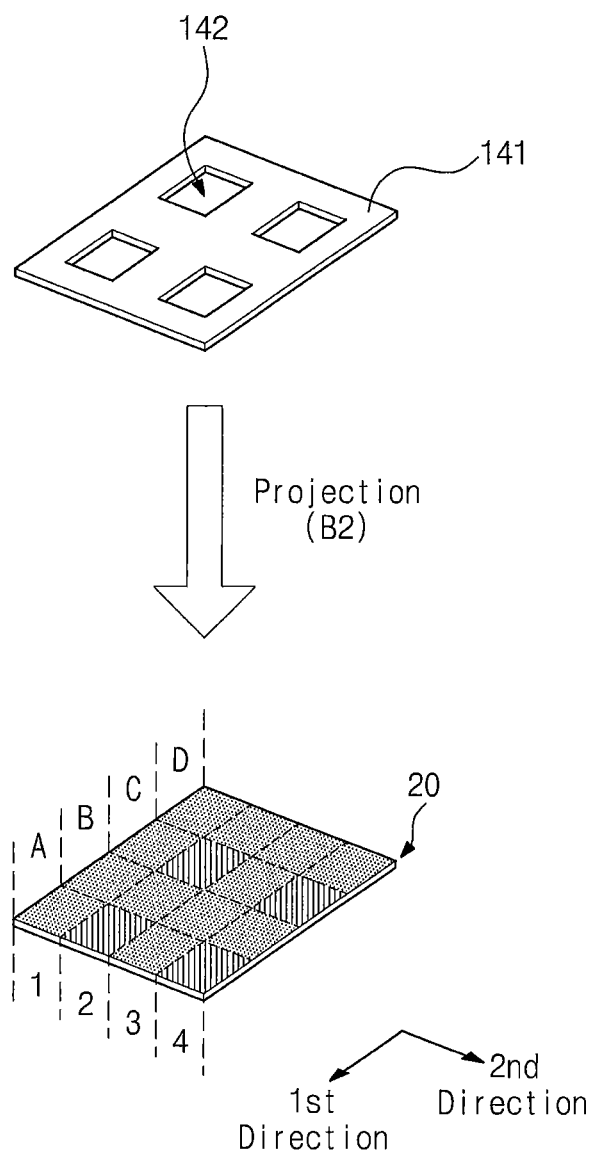

After the projection of the second beamlets B2 is completed, positions to which the second beamlets B2 are to be projected may be moved by the deflecting elements 180. For example, positions to which the second beamlets B2 are to be projected may be moved along the first direction. FIG. 11 shows an example in which positions to which the second beamlets B2 are to be projected is adjusted. Referring to FIG. 11, the second beamlets B2 may be projected to a pixel at the A row and the second column, a pixel at the A row and the fourth column, a pixel at the C row and the second column, and a pixel at the C row and the fourth column with regard to the target object 20. Pixels to which the second beamlets B2 were previously projected are illustrated as dotted areas, and pixels to which the second beamlets B2 are currently projected are indicated with hatching. In some embodiments, as described with reference to FIG. 5, the beam projection device 100 may project the second beamlets B2 using different frequencies, thereby increasing the resolution of projection.

According to the process described with reference to FIGS. 8 to 11, the second beamlets B2 may be only once projected to each of pixels on the target object 20. Afterwards, positions to which the second beamlets B2 are to be projected may be moved for duplicate or redundant exposure. FIG. 12 shows an example in which positions to which the second beamlets B2 are to be projected are moved for duplicate exposure or redundant exposure.

Referring to FIG. 12, upon execution of duplication exposure or redundancy exposure, pixels to which the second beamlets B2 are to be projected may be arranged to be dislocated with respect to pixels to which the second beamlets B2 are previously projected. For example, pixels where duplicate or redundant exposure is to be performed may be arranged in the A to C rows and the first to third columns as illustrated in FIG. 12. One pixel may include a portion of each of two or more pixels associated with previous exposure.

Figure 13:
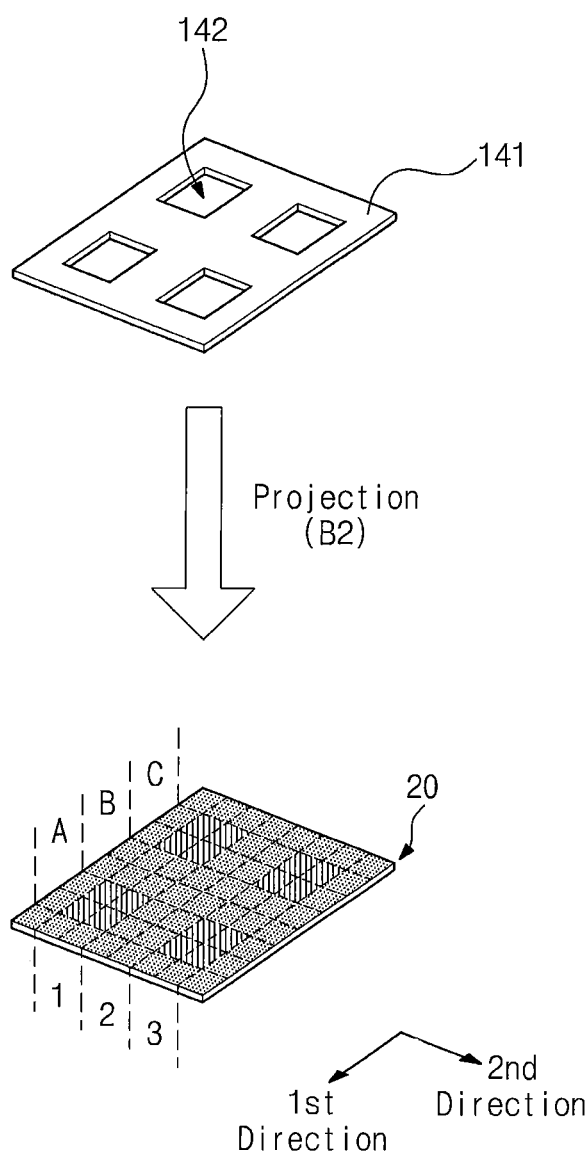

Afterwards, the second beamlets B2 may be projected according to a manner described with reference to FIGS. 8 to 11. Referring to FIG. 13, the second beamlets B2 may be projected to a pixel at the A row and the first column, a pixel at the A row and the third column, a pixel at the C row and the first column, and a pixel at the C row and the third column with regard to the target object 20. Pixels to which the second beamlets B2 were previously projected are illustrated as dotted areas, and pixels to which the second beamlets B2 are currently projected are identified using hatching. In some embodiments, as described with reference to FIG. 5, the beam projection device 100 may project the second beamlets B2 using different frequencies, thereby increasing the resolution of projection. Afterwards, as described with reference to FIGS. 8 to 11, positions to which the second beamlets B2 are to be projected may be moved by the deflecting elements 180, and the second beamlets B2 may be sequentially projected to the pixels on the target object 20.

As illustrated in FIG. 13, duplicate or redundant exposure may produce pixels on the target object 20 that are reduced in size. Accordingly, the duplicate or redundant exposure may be used as a method for improving the resolution of beam projection about the target object 20.

Since a space of the blanking aperture array 140 where the electrode control circuits 145 are disposed is markedly limited, operations to increase the resolution of the beam projection may include an increase in a duplicate exposure or redundant exposure frequency or iterative projection using different frequencies. To increase a duplicate or redundant exposure frequency may require more time compared with iterative projection using different frequencies according to some embodiments of the inventive concept. According to some embodiments of the inventive concept, compared with duplicate or redundant exposure, the iterative projection may make it possible to reduce processing time. This may reduce manufacturing cost.

Figure 14:
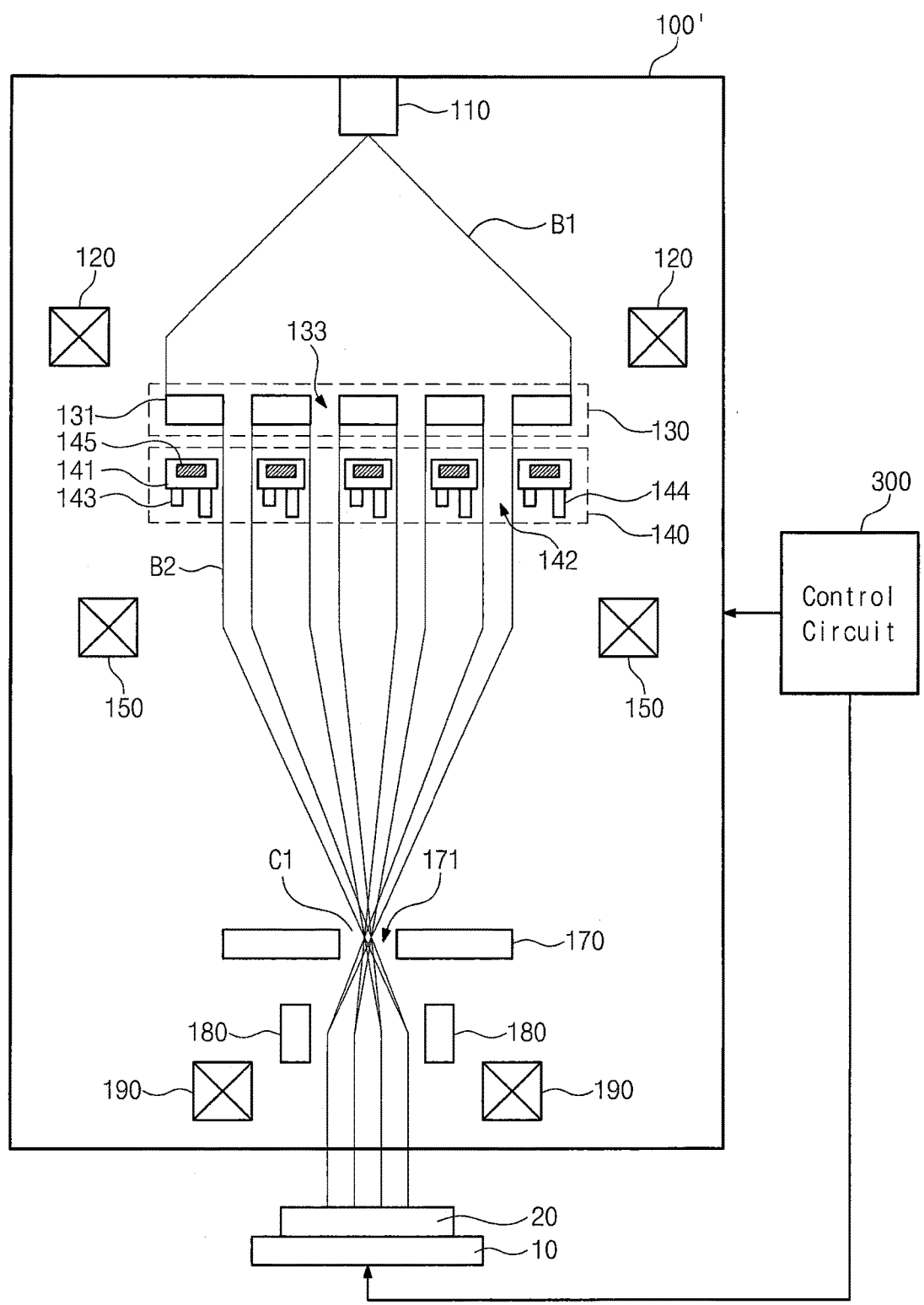
FIG. 14 shows an application of a beam projection device of FIG. 1.

FIG. 14 shows a system with a beam projection device 100' according to further embodiments. Compared with the beam projection device 100 of FIG. 1, the beam projection device 100' of FIG. 14 may not include the third lenses 160. Furthermore, the second beamlets B2 may pass through only one crossing C1 at the limiting aperture 171 of the limiting aperture plate 170. The first electrodes 143 and the second electrodes 144 may be formed on a lower surface of the blanking aperture array 141, that is, on a surface opposite to a surface of the blanking aperture array 141 facing the aperture array 130. The beam projection device 100' and a stage 10 holding a target object 20 may be controlled by a system control circuit 300.

According to some embodiments of the inventive concept, a mask with improved resolution may be manufactured by projecting a beam based on different frequencies. Accordingly, it may be possible to provide a beam projection device with improved resolution and methods for projecting a beam with improved resolution.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A beam projection device, comprising: a charged particle beam source configured to radiate a first beam; an aperture plate having a first array of apertures therein, respective ones of the apertures configured to generate respective second beams from the first beam; a blanking aperture plate having an array of blanking apertures therein corresponding to respective apertures of the first array of apertures and configured to selectively deflect second beams passing therethrough responsive to voltages applied to respective potential electrodes of the blanking apertures; a limiting aperture plate comprising a limiting aperture configured to pass ones of the second beams not deflected by the blanking apertures; and a plurality of electrode control circuits, respective ones of which are configured to apply voltages to respective ones of the potential electrodes, wherein, during a first time interval, the plurality of electrode control circuits applies voltages to the potential electrodes for durations based on clock signal with a first frequency, wherein, during a second time interval, the plurality of electrode control circuits applies voltages to the potential electrodes for durations based on a clock signal with a second frequency different from the first frequency, and wherein, during the first time interval and second time interval, beams passing through the limiting aperture are projected on the same target object to provide overlapping exposures of the target object.

2. The beam projection device of claim 1, wherein during the first time interval, each electrode control circuit is configured to adjust a time when a ground voltage is applied to an associated potential electrode and a time when a non-ground voltage is applied thereto, based on an N-bit resolution (N being a positive integer), and wherein during the second time interval, each electrode control circuit is configured to adjust a time when the ground voltage is applied to an associated potential electrode and a time when the non-ground voltage is applied thereto, based on the N-bit resolution.

3. The beam projection device of claim 2, wherein the second frequency is $2^N$ times the first frequency.

4. The beam projection device of claim 1, wherein the plurality of electrode control circuits operates in response to a clock signal, and wherein the clock signal has the first frequency during the first time interval and has the second frequency during the second time interval.

5. The beam projection device of claim 4, wherein each electrode control circuit comprises:
a register configured to store N-bit data;
a counter configured to perform a count operation from an initial value to a value of the N-bit data stored in the register; and
a buffer configured to apply a ground voltage to an associated potential electrode while a count value of the counter increases and to apply a non-ground voltage to the associated potential electrode when a count value of the counter does not increase.

6. The beam projection device of claim 5, wherein during a first setting time interval preceding the first time interval, the register is set to store first N-bit, data and the counter is reset, and
wherein during a second setting time interval between the first time interval and the second time interval, the register is set to store second N-bit data and the counter is reset.

7. The beam projection device of claim 4, further comprising:
a clock generation unit configured to output a first clock signal of the first frequency and a second clock signal of the second frequency; and
a multiplexer configured to output the first clock signal as the clock signal during the first time interval and to output the second clock signal as the clock signal during the second time interval.

8. The beam projection device of claim 7, wherein the clock generation unit comprises:
a clock generator configured to generate the first clock signal; and
a frequency divider configured to generate the second clock signal by dividing the first clock signal.

9. The beam projection device of claim 7, wherein the clock generation unit comprises:
a clock generator configured to generate the first clock signal; and
a frequency multiplier configured to generate the second clock signal by multiplying the first clock signal.

10. The beam projection device of claim 1, wherein during a third time interval, the plurality of electrode control circuits is configured to apply a ground voltage and a non-ground voltage to each of the potential electrodes based on a third frequency different from the first frequency and the second frequency.

11. The beam projection device of claim 10, further comprising:
a clock generation unit configured to output a first clock signal of the first frequency, a second clock signal of the second frequency, and a third clock signal of the third frequency; and
a multiplexer configured to output the first clock signal during the first time interval, to output the second clock signal during the second time interval, and to output the second clock signal during the third time interval.

12. The beam projection device of claim 11, wherein the plurality of electrode control circuits operates in response to a clock signal output from the multiplexer.

13. The beam projection device of claim 11, wherein the clock generation unit comprises:
a clock generator configured to generate the first clock signal;
a first frequency divider configured to generate the second clock signal by dividing the first clock signal; and
a second frequency divider configured to generate the third clock signal by dividing the second clock signal.

14. The beam projection device of claim 1, wherein the second beams passing through the limiting aperture of the limiting aperture plate are projected to a target object.

15. The beam projection device of claim 14, wherein positions on the target object to which the second beams are to be projected are fixed while the first time interval and the second time interval elapse.

16. The beam projection device of claim 14, wherein positions on the target object to which the second beams are to be projected are moved after the first time interval and the second time interval elapse.

17. The beam projection device of claim 1, wherein during the first time interval, each electrode control circuit adjusts, by a unit associated with the first frequency, times to apply a ground voltage and a non-ground voltage to a potential electrode based on first input data; and
wherein during the second time interval, each electrode control circuit adjusts, by a unit associated with the second frequency, times to apply the ground voltage and the non-ground voltage to a potential electrode based on second input data.

18. A system comprising: an aperture array comprising a plurality of active apertures, respective ones of the active apertures configured to selectively deflect beams passing therethrough; a limiting aperture configured to pass beams not deflected by the active apertures to a target object; and a control circuit configured to control the active apertures to provide first and second different exposure duration resolutions, wherein, for the first and second different exposure duration resolutions, beams passing through the limiting aperture are projected on the target object to provide overlapping exposures of the target object; wherein the control circuit is configured to cause the active apertures to project beams through the limiting aperture for first durations determined by a first clock signal having a first frequency to provide a first exposure duration resolution in a first exposure interval and to cause the active apertures to project beams through the limiting aperture for second durations determined by a second clock signal having a second frequency different from the first frequency to provide a second exposure duration resolution different from the first exposure duration resolution in a second exposure interval; wherein the beams are charged particle beams.

19. The system of claim 18, wherein the active apertures comprise respective electrodes configured to control beam deflection and wherein the control circuit comprises respective electrode control circuits configured to apply respective electrode control signals to respective ones of the electrodes.

20. The system of claim 19, wherein each of the electrode control circuits comprises:
a register configured to store a digital value representative of an exposure duration;
a counter circuit configured to receive a clock signal, to generate a count responsive to the received clock signal and to generate a count status signal responsive to the count and the digital value stored in the register; and
a buffer circuit configured to generate an electrode control signal responsive the count status signal.

21. The system of claim 20, wherein the control circuit further comprises:
a clock generation circuit configured to generate the first and second clock signals; and a clock selection circuit configured to selectively pass the first and second clock signals to the counter circuits of the electrode control circuits.

22. The system of claim 21, wherein the clock generation circuit comprises:
a clock signal generator circuit that generates the first clock signal; and
a frequency divider that generates the second clock signal from the first clock signal.

23. The system of claim 18, further comprising a second array of apertures configured to provide the beams to the active apertures.

24. The system of claim 23, further comprising a charged particle beam source configured to generate a source beam and wherein the second array of apertures is configured to pass the beams provided to the active apertures from the source beam.

* * * * *